(12) United States Patent
Jayaswal et al.

(10) Patent No.: US 11,757,396 B1
(45) Date of Patent: Sep. 12, 2023

(54) BROAD-SPECTRUM SOLAR ENERGY SYSTEM HAVING OPTICAL RECTENNA AND PHOTOVOLTAIC CELL (71) Applicant: Princess Nourah Bint Abdulrahman University, Riyadh (SA)

(72) Inventors: Gaurav Jayaswal, Punjab (IN); Manish Hooda, Punjab (IN); Amita Chaudhry, Punjab (IN); Abdullah Alodhayb, Riyadh (SA); Tahani A Alrebdi, Riyadh (SA); Ghada Ahmed Khouqeer, Riyadh (SA)

(73) Assignee: Princess Nourah Bint Abdulrahman University, Riyadh (SA)

( * ) Notice: Subject to any disclaimer, the term of this patent is extended or adjusted under 35 U.S.C. 154(b) by 0 days.

(21) Appl. No.: 18/163,840

(22) Filed: Feb. 2, 2023

(51) Int. Cl.
  *H02S 10/30* (2014.01)
  *H01L 31/0236* (2006.01)
  *H02S 40/32* (2014.01)
  *H02J 50/00* (2016.01)

(52) U.S. Cl.
  CPC ........ *H02S 10/30* (2014.12); *H01L 31/02363* (2013.01); *H02J 50/001* (2020.01); *H02S 40/32* (2014.12)

(58) Field of Classification Search
  CPC ........ H02S 10/30; H02S 40/32; H02J 50/001; H01L 31/02363
  See application file for complete search history.

(56) References Cited

U.S. PATENT DOCUMENTS

| | | | |
|---|---|---|---|
| 2007/0034247 A1* | 2/2007 | Takada | H02J 50/27 136/244 |
| 2013/0193769 A1* | 8/2013 | Mehta | H02J 50/50 52/173.3 |

* cited by examiner

*Primary Examiner* — Tae-Sik Kang
(74) *Attorney, Agent, or Firm* — SV Patent Service (57) ABSTRACT

A broad-spectrum solar energy system includes a photovoltaic system that includes photovoltaic cells configured to produce a DC voltage in response to visible and ultraviolet (UV) light. The photovoltaic cells can produce waste heat in producing the DC voltage. An inverter converts the DC voltage to a first AC voltage. A rectenna system coupled with the photovoltaic system includes a first antenna having a resonance at a first wavelength; and a second antenna having a resonance at a second wavelength. The first antenna and the second antenna can absorb energy at least in the infrared (IR) wavelength range and convert the energy to a second AC voltage. The first antenna and/or the second antenna can absorb the waste heat produced by the plurality of photovoltaic cells and convert the waste heat to the second AC voltage. Power is supplied from the first AC voltage and the second AC voltage.

12 Claims, 7 Drawing Sheets

BROAD-SPECTRUM SOLAR ENERGY SYSTEM HAVING OPTICAL RECTENNA AND PHOTOVOLTAIC CELL

BACKGROUND OF THE INVENTION

The present application relates to renewable energy technologies, and in particular, to an efficient solar energy system that can absorb photons in a broad electromagnetic spectrum.

Humankind needs energy for living. Energy usage has continued to increase because of our demands due to emerging new technologies, industrial developments, and the population increase. People started to seek new energy sources different than traditional energy resources. Fossil fuels are still the dominant energy sources, with oil and coal having 33.1% and 30.3% share of total energy use in 2011, and coal use witnessing a record 5.4% increase in the same year. In contrast, the share of all renewable energy sources in total energy use, including solar, wind, biofuels, and others, is a meager 2.1%. In comparison to the increasing energy demands, the growth in the supply and production of energy is lagging. In fact, some studies reveal that the world has already consumed half of its oil reserves and passed the peak oil production by 2005. It is forecasted that, in 2050, oil production will be only 18% of what it is today. Similarly, coal and natural gas are predicted to meet their peak production around 2025 and will thereafter experience a decline like that of oil.

The increasing energy demand and the decrease in energy supply clearly point to the urgent need to reduce our dependence on fossil fuels and to seek renewable sources of energy. A new era of renewable energy was started with the creation of the first photovoltaic solar cell in 1950. While much progress has been made in photovoltaic technologies, there is a continued need to improve their efficiencies so it can be economically applied to a wide range of applications in competition with other energy sources.

SUMMARY OF THE INVENTION

The present application discloses a novel design of integrating the photovoltaics cell with an optical rectenna system. The IR energy is harvested by using rectenna and integrated with photovoltaics cells to increase the overall efficiency of the solar energy system.

In one general aspect, the present invention relates to a broad-spectrum solar energy system that includes a photovoltaic system that includes a plurality of photovoltaic cells that can produce a DC voltage in response to visible and ultraviolet (UV) light, wherein the plurality of photovoltaic cells are configured to produce waste heat in producing the DC voltage, and an inverter configured to convert the DC voltage to a first AC voltage, a rectenna system coupled with the photovoltaic system that includes a first antenna having a resonance at a first wavelength and a second antenna having a resonance at a second wavelength, wherein the first antenna and the second antenna can absorb energy at least in the infrared (IR) wavelength range and convert the energy to a second AC voltage, wherein at least one of the first antenna and the second antenna can absorb the waste heat produced by the plurality of photovoltaic cells and convert the waste heat to the second AC voltage, and a main power supply configured to receive power supplied by the first AC voltage and the second AC voltage.

Implementations of the system may include one or more of the following. The rectenna system can include a plurality of antenna having resonance wavelengths in a range from 1 µm to 15 µm. The resonance wavelengths of the plurality of antenna can include 2.5 µm, 5 µm, 7 µm, 8 µm, or 10.6 µm. The rectenna system can further include a rectifier configured to rectify the second AC voltage to produce a rectified AC voltage, wherein the rectified AC voltage can be supplied to the main power supply. The rectifier can include a tunnel diode that is impedance matched with the first antenna and the second antenna. The tunnel diode can include a Metal-Insulator-Insulator-Metal structure or a Metal-Insulator-Metal structure. The insulator can include ZnO/HfO2 oxide material. At least one of the first antenna or the second antenna can include a series of diodes with the respective P-N junctions connected in bow-tie configurations. The first antenna and the second antenna can have different lengths respectively optimized for resonance absorption at the first wavelength and for resonance absorption at the second wavelength. At least one of the first antenna or the second antenna can include electromagnetic resonance structures having dimensions in nanometer range. The photovoltaic cells in the photovoltaic system can include a plurality of pyramid structures. The waste heat produced by the plurality of photovoltaic cells can include electromagnetic waves in a frequency range of terahertz.

An advantage of the presently disclosed broad-spectrum solar energy system is increased energy harvesting and energy efficiency over a broader electromagnetic spectrum.

Moreover, the disclosed broad-spectrum solar energy system also helps to reduce waste heat and cool off the photovoltaic device, equipment, and the environment.

DETAILED DESCRIPTION OF THE INVENTION

In photovoltaic (PV) solar cells, the conversion is dependent on the material bandgap, resulting in low conversion efficiency. Conversion of visible light requires daylight, and thus, PV based technologies suffer from weather sensitivity.

According to Lawrence Livermore National Laboratory, more than 60% of the energy is U.S. (around 293 billion kilowatt-hours) is wasted. Most of this energy is wasted as heat from manufacturing processes, and from automobiles.

Infrared (IR) energy harvesting from waste heat can be a promising contribution for sustainable energy.

Waste heat varies, approximately, between 400 K and 2000 K (2-11 μm in wavelengths) and is produced by different sources such as metal heating and melting, steam generation, fluid heating, heat treating, and agglomeration. Waste heat from power plants and steam electric power generators can be a significant source for IR energy harvesting. In the latter case, about two-thirds of the energy of the prime mover (fuel) is lost in the form of "waste heat" discharged to the environment.

In an aspect of the presently disclosed system, energy is harvested from waste heat to lower the lower of renewable energy. Waste heat is defined as heat generated as a by-product of a process, which has been explored to a lesser extent than other sources. In the presently disclosed system, waste heat in the form of very high frequency (terahertz or THz) electromagnetic waves is collected and rectified by a combination of nanoantenna and rectifier.

In some embodiments, a presently disclosed broad-spectrum solar energy system includes photovoltaic cells for absorbing photons in the visible and UV wavelength range and an optical rectenna system for absorbing very high frequency (terahertz or THz) electromagnetic waves.

Figure 1:
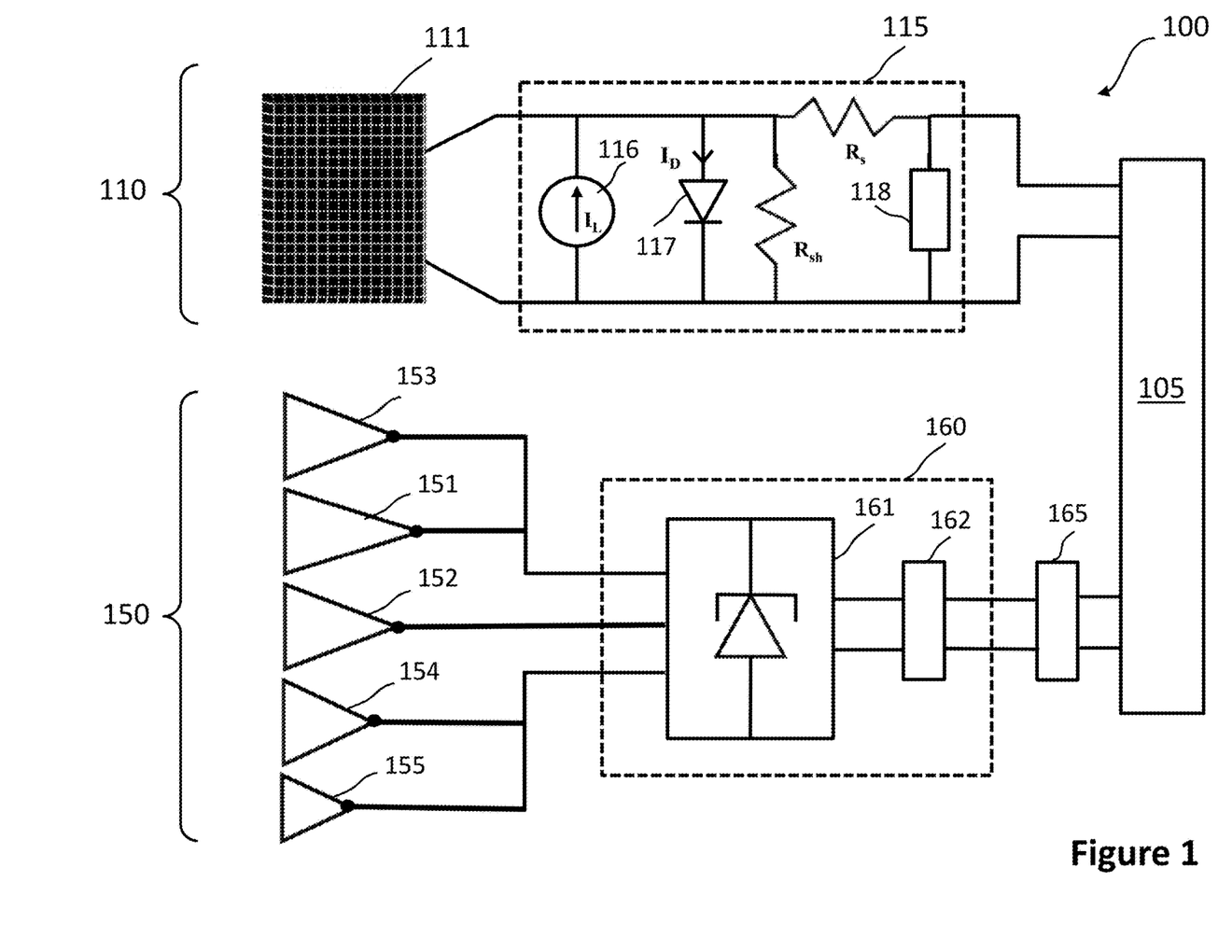
FIG. 1 is a system block diagram of a broad-spectrum solar energy system in accordance with some embodiments of the present invention.
Figure 2:
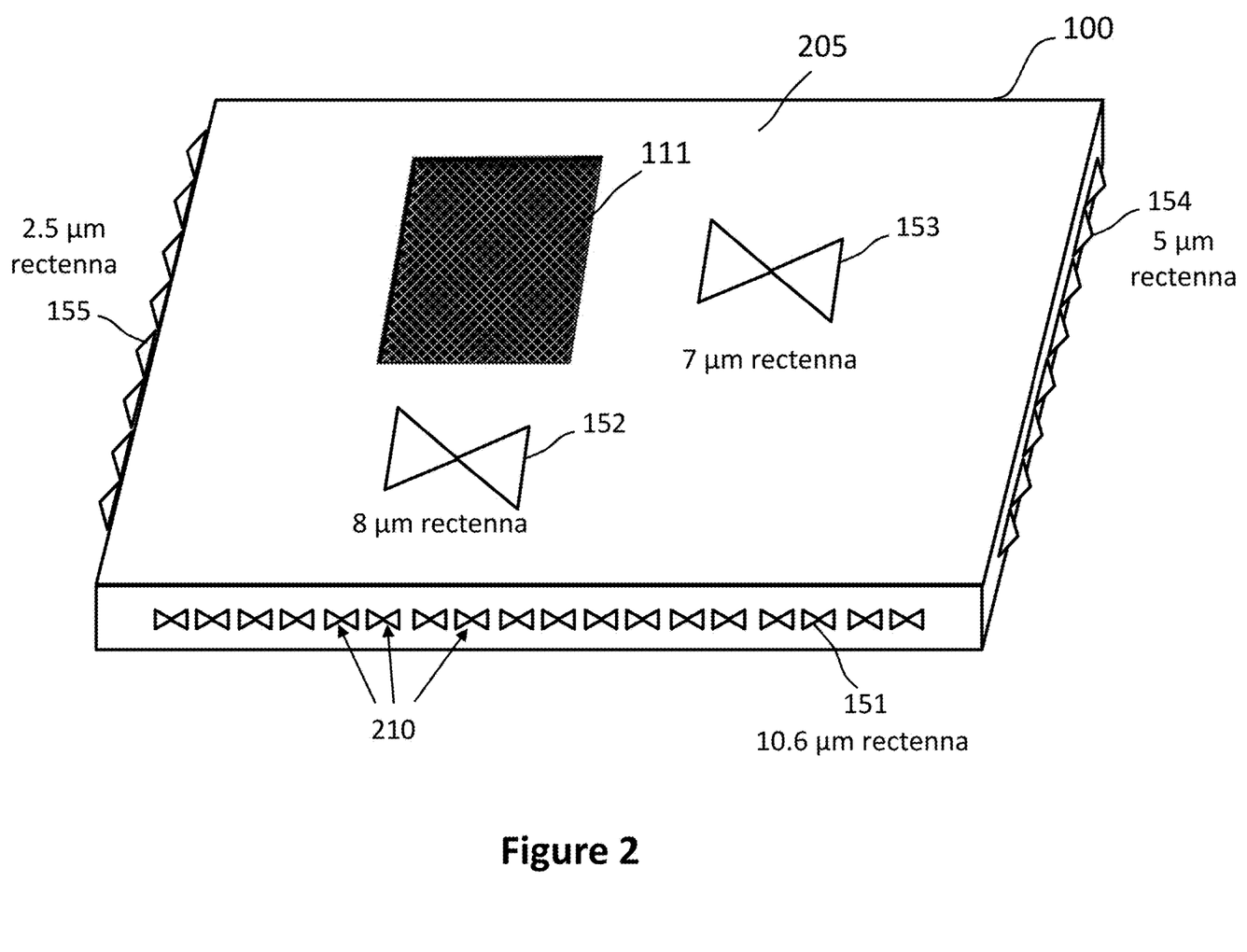
FIG. 2 is a schematic illustration of the broad-spectrum solar energy system shown in FIG. 1.

Referring to FIGS. 1 and 2, a broad-spectrum solar energy system 100 includes a photovoltaic system 110, a rectenna system 150, and a main power supply 105 that receives electric power from the photovoltaic system 110 and the rectenna system 150. The photovoltaic system 110 includes a photovoltaic module 111 and an inverter 115. The photovoltaic module 111 includes a plurality of photovoltaic cells that can absorb visible light and UV light and convert respective photons into photoelectrons that outputs a low-voltage DC current. The inverter 115 converts the low-voltage DC current into an AC current at a higher voltage (e.g., 110 V, 220 V, 380 V, etc.). The inverter 115 includes a resistor 116 that passes a current IL produced by the photovoltaic module 111, a diode 117, a resistor $R_{sh}$, a resistor $R_s$, and a load 118. The resulting AC power on the load 118 is output to the main power supply 105.

The rectenna system 150 includes a plurality of antenna 151-155 that have varying arm lengths for resonating to the different wavelengths such as a range from 1 μm to 15 μm, or specifically, 2.5 μm, 5 μm, 7 μm, 8 μm, 10.6 μm in the infrared range. The rectenna system 150 is coupled at least thermally with the photovoltaic system 110. The heat waste produced by the photovoltaic system 110 is treated as an energy source in the IR range. The incident IR radiation is collected by the antennas 151-155, which respectively output AC currents.

In some embodiments, the antenna 151-155 can take the form of a bow-tie antenna mounted at different side and face locations of the rectenna system 150 (as shown in FIG. 2). The antenna in bow-tie configuration has been found to be particularly efficient in absorbing IR radiation from the ambient environment as well as waste heat produced by the photovoltaic module 111 and an inverter 115.

In some embodiments, antennas 151-155 can be nanoantennas composed electromagnetic resonance structures having dimensions in nanometer range. In order to match the resonant frequency of the waste heat, the antenna can have small dimensions. Nano-antennas can be suitable with the broad-spectrum solar energy system 100.

The rectenna system 150 includes an integrated rectifier 160 that rectifies the AC currents from the antennas 151-155. The integrated rectifier 160 includes a tunnel diode 161 and a filter 162. The tunnel diode 161 works on the principle of quantum tunneling. The work function difference between the metal arms can create a potential barrier which support electrons to tunnel from one end to another through a very thin insulating/oxide layer. The rectified AC voltage from the integrated rectifier 160 is received by a load 165, which outputs power to the main power supply 105.

FIG. 2 shows a schematic illustration of the broad-spectrum solar energy system 100. The photovoltaic module 111 can be mounted on a face 205 of the chassis. Each of the antennas 151-155 antenna includes a series of diodes with their P-N junctions 210 in bow-tie configurations, connected in a serial circuit. The antennas 151-155 can be distributed and mounted along the edges and the faces of the chassis of the broad-spectrum solar energy system 100. The antennas 151-155 are customized with varying arm lengths having resonance wavelengths such as 2.5 μm, 5 μm, 7 μm, 8 μm, and 10.6 μm as indicated in FIG. 2. The advantage of using bow-tie antenna is that they can produce very high field enhancement compared to some conventional antenna configurations. Here the group velocity and phase velocity become zero at the sharp tip of the bow-tie arm, leading to a very high field enhancement.

Moreover, the disclosed broad-spectrum solar energy system also helps to reduce waste heat and cool off the pertinent device, equipment, and environment. Rectennas in principle have no efficiency limitations since the major problem of the semiconductor band gap is no longer an issue. Efficient collection by the antenna, perfect matching between the diode and antenna, and efficient rectification can result in high rectenna efficiencies.

Figure 3:
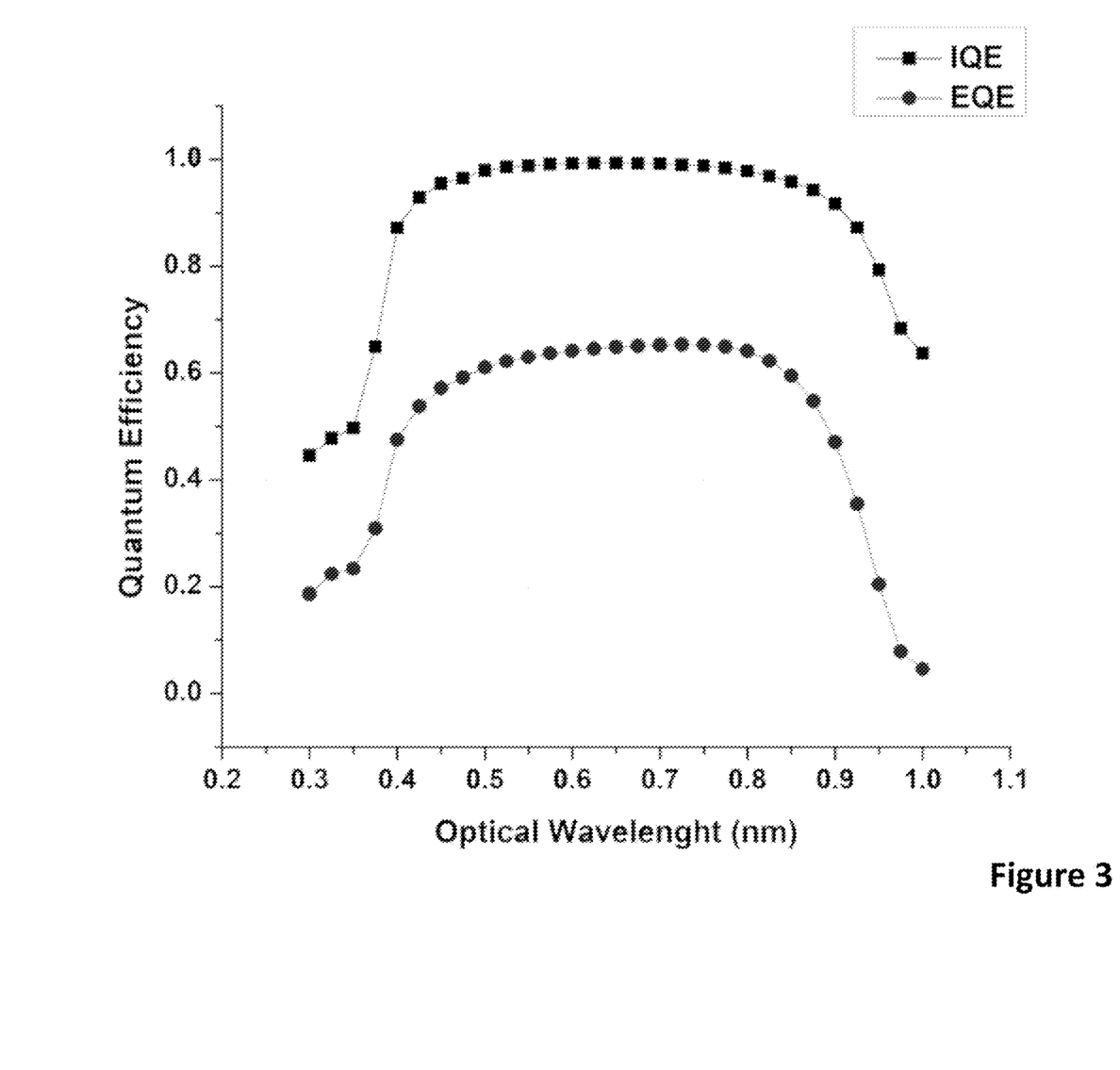
FIG. 3 is a plot showing the internal quantum efficiency and the external quantum efficiency of the photovoltaic solar cell suitable for the disclosed broad-spectrum solar energy system.

The internal and external quantum efficiency obtained by the photovoltaic solar cells are simulated with the results shown in FIG. 3. The relationship between internal and external quantum efficiency is given by equation 1:

$$IQE=EQE/(1-R), \qquad (1)$$

where IQE is the internal quantum efficiency which represents the fraction of absorbed photons that are being converted to electrons in the device, EQE is the external quantum efficiency which indicates the fraction of incident photons that is converted to electrons in the device, and R is the reflectance data.

Figure 4:
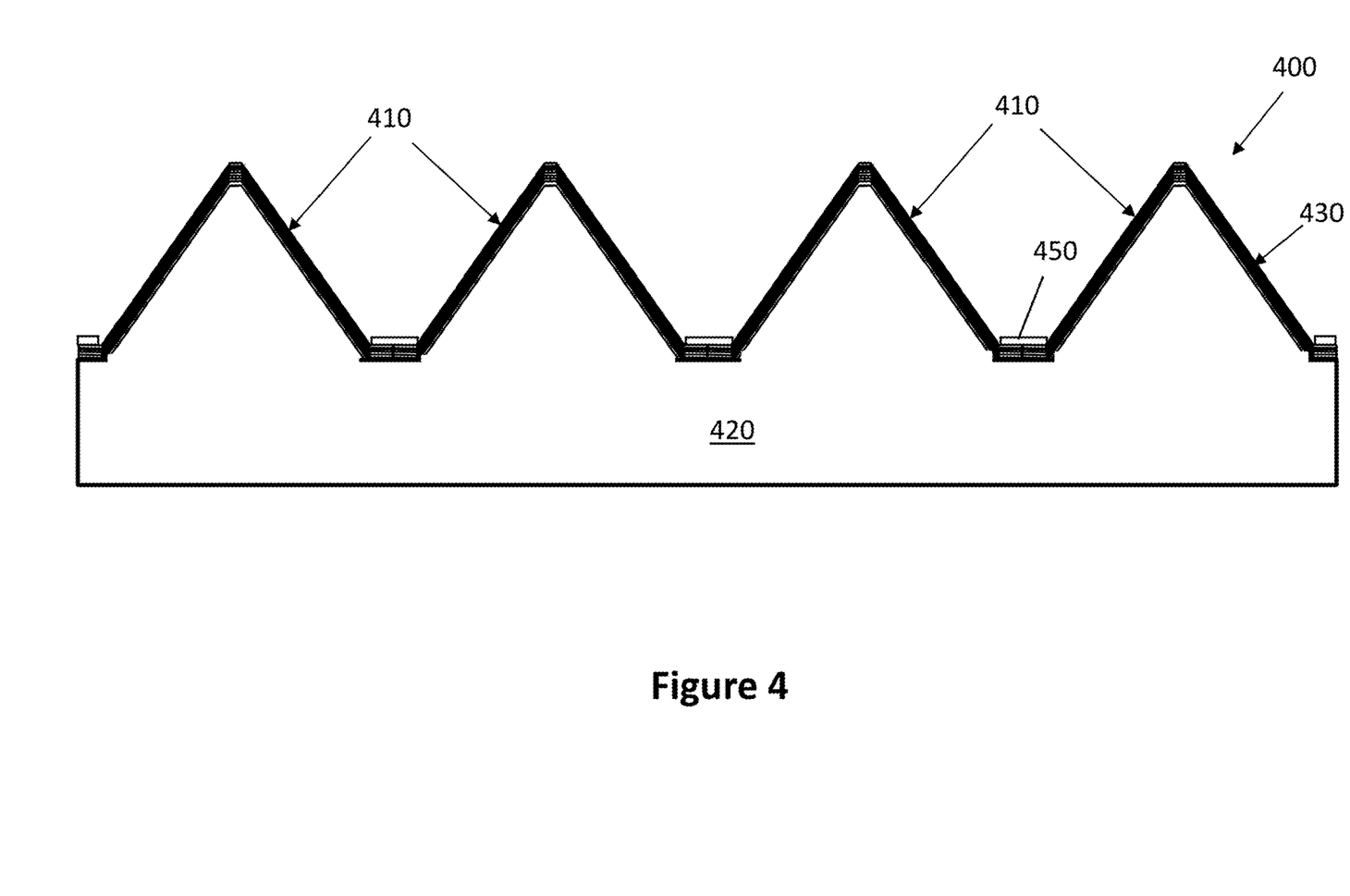
FIG. 4 is a cross-sectional view of pyramid shaped solar cells suitable for the broad-spectrum solar energy system in accordance with some embodiments of the present invention.

In some embodiments, the photovoltaic cells in the photovoltaic module 111 (FIGS. 1 and 2) are formed in a plurality of pyramid structures designed to capture the maximal amount of visible and UV light. Referring to FIG. 4, a photovoltaic cell 400 includes pyramid structures 410 on a silicon substrate 420. Semiconductor p-n junction layers 430 are formed on the pyramid structures 410 for absorbing visible and UV light. Electrode layers 450 are formed on the semiconductor p-n junction layers 430. A photovoltage is produced between the electrode layers 450 and the doped silicon substrate 420 in the presence of UV or visible light. Reflected lights can also be at least partially captured and absorbed by such a structure.

Figure 5:
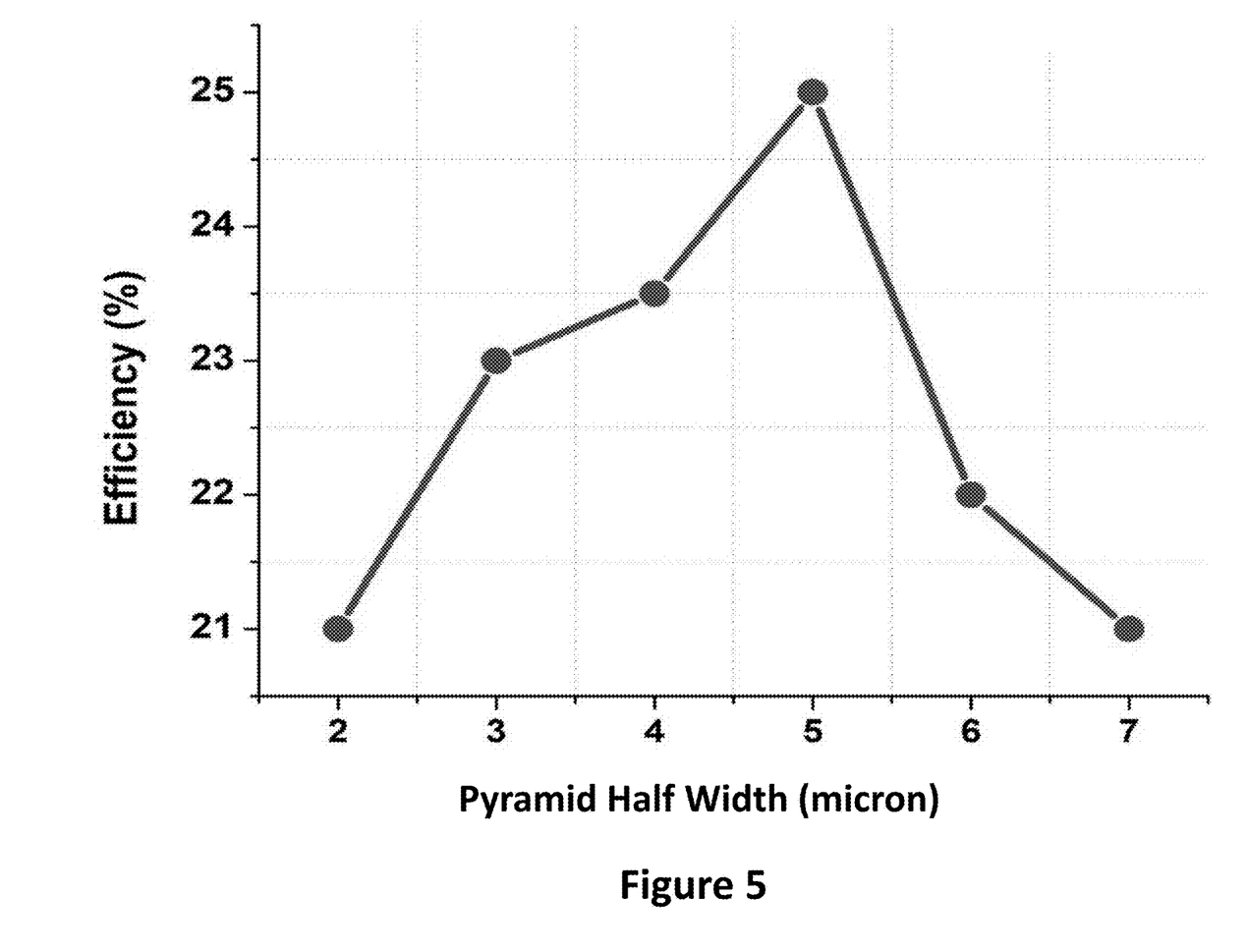
FIG. 5 is a plot showing the energy-conversion efficiency of pyramid shaped solar cells as a function of the half pitch-length of the pyramid shaped solar cells in FIG. 4.

Referring to FIG. 5, the energy conversion efficiency of the photovoltaic cell 400 was simulated as a function of the half pitch of the periodic pyramid structure. A maximum efficiency of approximately 25% is observed in the photovoltaic cell 400. The incorporation of the pyramid structure enhances the light trapping in the photovoltaic module 111 (FIGS. 1 and 2), which results in higher efficiency.

The integration of pyramid photocell structure with rectenna system can enhance the overall efficiency of the broad-spectrum solar energy system 100. The PV cells work well in day light, but their efficiency is highly dependent on weather conditions. The integration of PV with rectenna systems is able to work around the clock irrespective of weather conditions and day light.

The wavelengths of the IR radiation of the waste heat are in a range from 2 μm to 15 μm having a peak intensity at 10.6 μm. In this work, we have designed a broadband rectenna system to achieve a higher rectification ability. An important characteristic of the rectenna system is the resistance (Rr), which is given by the $$R_r = \frac{1}{\frac{dI}{dV}} \quad (2)$$

A low value of (Rr) is essential to have a proper impedance matching between the tunnel diode 161 and the antenna 151-155 (FIG. 1).

The second parameter is the diode responsivity of the tunnel diode 161; the diode tunneling ability can be determined using this parameter. Diode responsivity can be expressed as follows:

$$\text{Responsivity} = \frac{1}{2}\left(\frac{d^2I}{dV^2} / \frac{dI}{dV}\right) \quad (3)$$

Diode responsivity determines the alternating current (AC) to DC conversion capability of a diode. A high diode responsivity means a tremendous rectification ability for the diode leading to higher efficiency.

The last parameter, diode cutoff frequency—is expressed as follows:

$$f_c = \frac{1}{2\pi R_r C} \quad (4)$$

$$C = \varepsilon_0 \varepsilon_r \frac{A}{d}, \quad (5)$$

where Rr is the equivalent resistance of the diode and antenna, C is the diode capacitance, $\varepsilon_0$ and $\varepsilon_r$ are relative permittivity and dielectric constant of an oxide material, A is the junction area in the diode, and d is the oxide thickness, respectively. Using different types of $M_1I_1I_2M_2$ (Metal (M1)-Insulator(I1)-Insulator(I2)-Metal(2)) diodes, the superior performance of multi-insulating layer diodes can be obtained over their single insulator counterparts.

Figure 6:
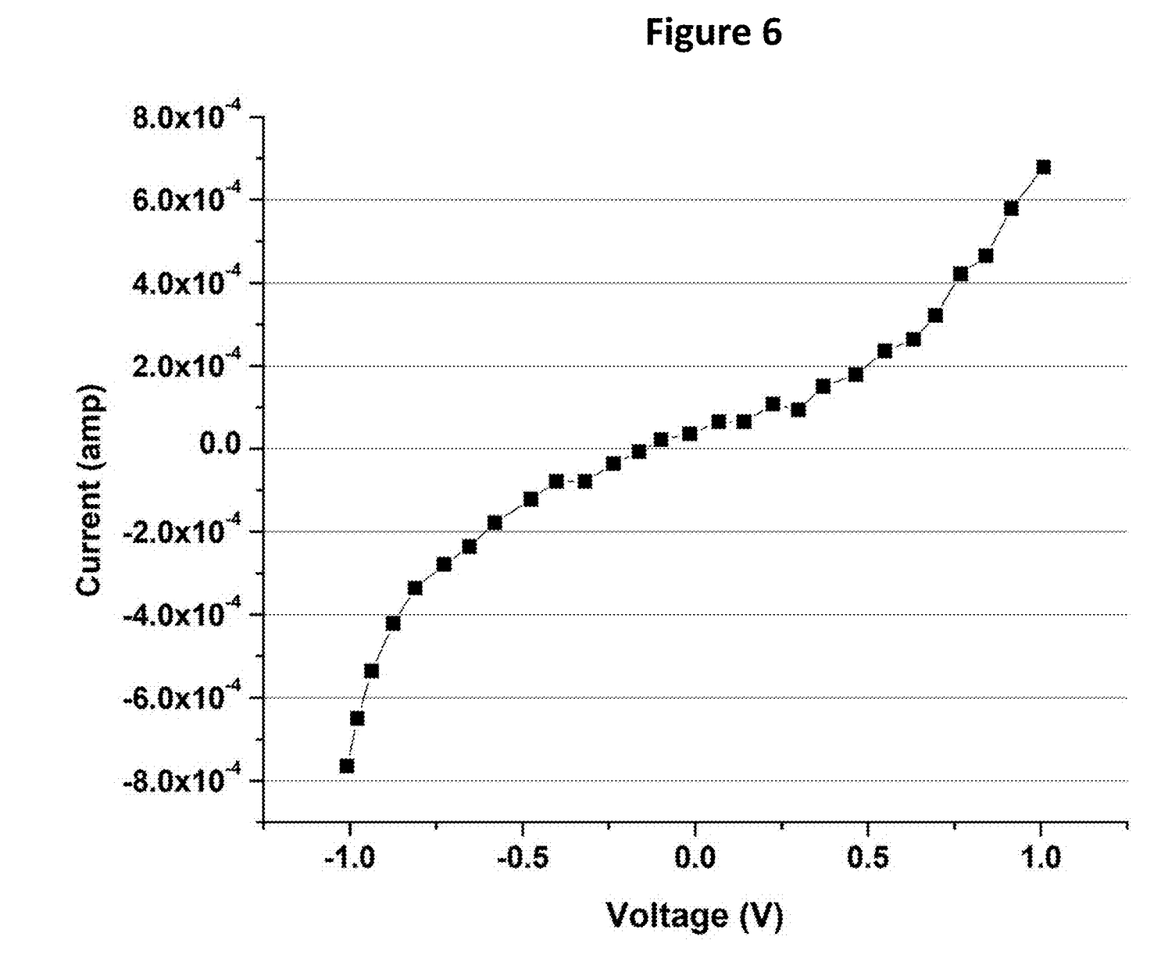
FIG. 6 shows simulated I-V characteristics of a rectenna system suitable for the disclosed broad-spectrum solar energy system.

The various possible best combinations of oxide material along with the optimized thickness have been investigated as the insulator material to have a high operating cut-off frequency. $Z_nO/H_fO_2$ oxide material combinations give higher nonlinearity for a fixed metal arm. As mentioned above, for energy harvesting applications, diodes must work without any aid of external bias. Only a handful of work has been reported to realize the passive rectenna system. The metal arms' work function plays a very crucial role in achieving a passive rectenna system. High work function difference enhances electron tunneling. The work functions' difference creates a Fermi-level gradient on both sides of the potential barrier, facilitating the electron tunneling through the oxide layer. Using the same simulation model, we have designed a broadband rectenna system by varying the size of bow-tie antenna (shown in FIG. 1) to match the cut-off frequency. For rectification, an MIM (Metal-Insulator-Metal) diode using $Z_nO/HfO_2$ is added to obtain higher nonlinearity. The I-V response of the rectenna system is shown in FIG. 6.

Higher Energy-Conversion Efficiency in a Broad Spectrum

The final rectenna efficiency is obtained from Equation 6:

$$\eta_{rectenna} = P_{out}/P_{in} \quad (6)$$

where $P_{out}$ is the output power of the rectenna system and $P_{in}$ is the input power, which was obtained by taking the combination of the waste heat and the energy released from the solar cell. The results obtained from the solar cells were fed as input to the broadband rectenna system along with the rectenna operating wavelengths.

Figure 7:
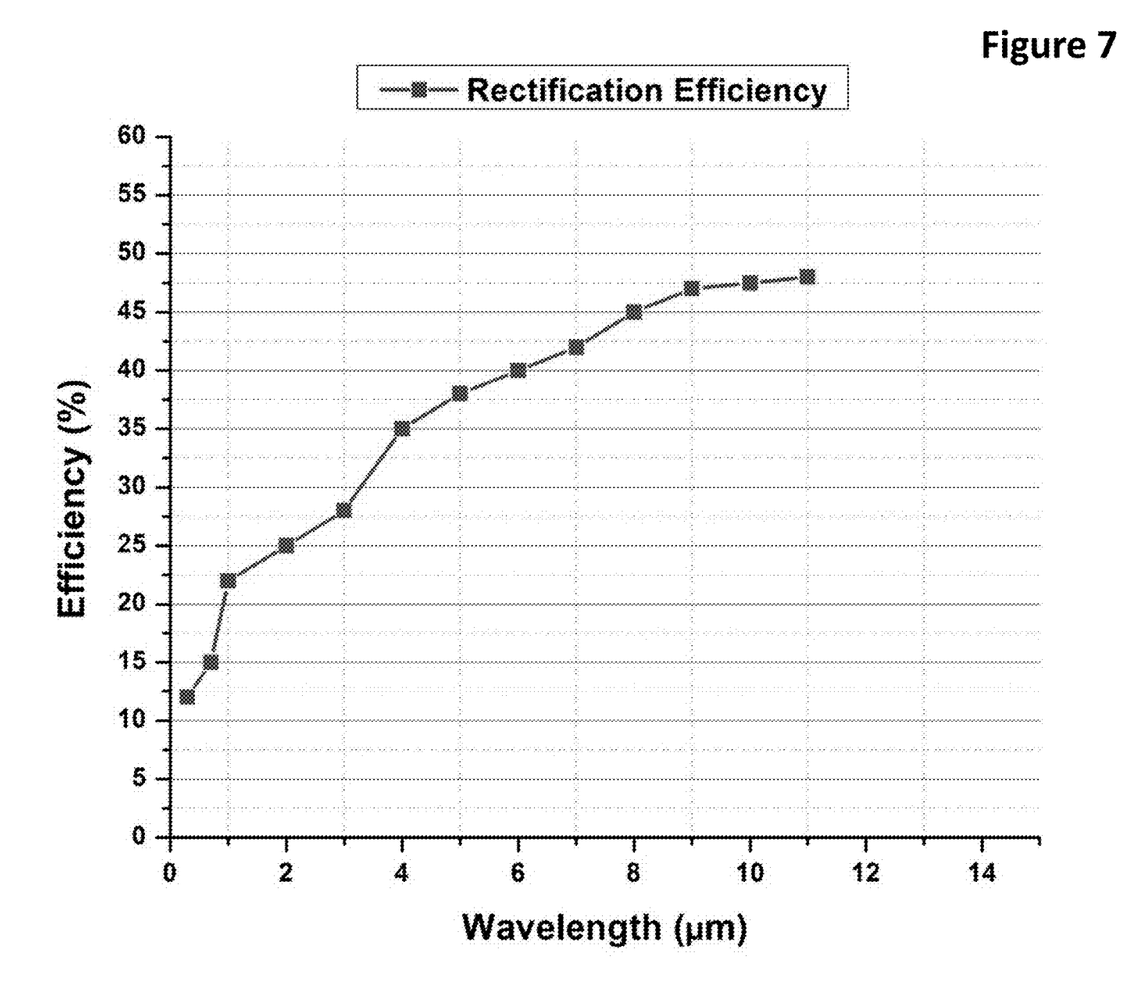
FIG. 7 shows the energy conversion efficiency over a broad spectral band accomplished by the disclosed broad-spectrum solar energy system shown in FIG. 1.

The overall energy efficiency of the disclosed broad-spectrum solar energy system is shown in FIG. 7. It is evident that the disclosed broad-spectrum solar energy system produces high-efficiency energy conversion and excellent rectification and tunneling ability, which is a significant benefit of the invention system.

Only a few examples and implementations are described. Other implementations, variations, modifications and enhancements to the described examples and implementations may be made without deviating from the spirit of the present invention. It should be noted that the presently disclosed broad-spectrum solar energy system is not limited to the specific examples described above. For example, the rectenna system can include different types of antenna and in different designs and connection configurations. The resonant wavelengths can vary from the described values, which are meant to be used as illustrating examples. The photovoltaic system can include the photovoltaic cells in other structures and configurations without deviating from the spirit of the present invention. The presently disclosed broad-spectrum solar energy system can be packaged in physical chassis in different shapes and forms from the example described above.

The invention claimed is:

1. A broad-spectrum solar energy system, comprising:
   a photovoltaic system, comprising:
      a plurality of photovoltaic cells configured to produce a DC voltage in response to visible and ultraviolet (UV) light, wherein the plurality of photovoltaic cells are configured to produce waste heat in producing the DC voltage; and
      an inverter configured to convert the DC voltage to a first AC voltage;
   a rectenna system coupled with the photovoltaic system, comprising:
      a first antenna having a resonance at a first wavelength; and
      a second antenna having a resonance at a second wavelength;
      wherein the first antenna and the second antenna are configured to absorb energy at least in the infrared (IR) wavelength range and convert the energy to a second AC voltage;
      wherein at least one of the first antenna and the second antenna is configured to absorb the waste heat produced by the plurality of photovoltaic cells and convert the waste heat to the second AC voltage; and
   a main power supply configured to receive power supplied by the first AC voltage and the second AC voltage.

2. The broad-spectrum solar energy system of claim 1, wherein the rectenna system includes a plurality of antenna having resonance wavelengths in a range from 1 μm to 15 μm.

3. The broad-spectrum solar energy system of claim 2, wherein the resonance wavelengths of the plurality of antenna comprise 2.5 μm, 5 μm, 7 μm, 8 μm, or 10.6 μm.

4. The broad-spectrum solar energy system of claim 1, wherein the rectenna system further comprises:
- a rectifier configured to rectify the second AC voltage to produce a rectified AC voltage, wherein the rectified AC voltage is supplied to the main power supply.

5. The broad-spectrum solar energy system of claim 4, wherein the rectifier comprises a tunnel diode that is impedance matched with the first antenna and the second antenna.

6. The broad-spectrum solar energy system of claim 5, wherein the tunnel diode includes a Metal-Insulator-Insulator-Metal structure or a Metal-Insulator-Metal structure.

7. The broad-spectrum solar energy system of claim 6, wherein the insulator includes $ZnO/HfO_2$ oxide material.

8. The broad-spectrum solar energy system of claim 1, wherein at least one of the first antenna or the second antenna includes a series of diodes with the respective P-N junctions connected in bow-tie configurations.

9. The broad-spectrum solar energy system of claim 1, wherein the first antenna and the second antenna have different lengths respectively optimized for resonance absorption at the first wavelength and for resonance absorption at the second wavelength.

10. The broad-spectrum solar energy system of claim 1, wherein at least one of the first antenna or the second antenna includes electromagnetic resonance structures having dimensions in nanometer range.

11. The broad-spectrum solar energy system of claim 1, wherein the photovoltaic cells in the photovoltaic system comprise a plurality of pyramid structures.

12. The broad-spectrum solar energy system of claim 1, wherein the waste heat produced by the plurality of photovoltaic cells includes electromagnetic waves in a frequency range of terahertz.

* * * * *